US006676005B2

(12) United States Patent
Itoh et al.

(10) Patent No.: US 6,676,005 B2
(45) Date of Patent: Jan. 13, 2004

(54) WIRE BONDING METHOD AND APPARATUS

(75) Inventors: Kenji Itoh, Fujisawa (JP); Naoki Kurosu, Fujisawa (JP); Yohtaroh Ichimura, Yokohama (JP); Tatsushi Yoshida, Chigasaki (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/196,841

(22) Filed: Jul. 17, 2002

(65) Prior Publication Data

US 2003/0010806 A1 Jan. 16, 2003

Related U.S. Application Data

(62) Division of application No. 09/629,789, filed on Jul. 31, 2000, now abandoned.

(30) Foreign Application Priority Data

Sep. 9, 1999 (JP) .......................................... 11-274113

(51) Int. Cl.[7] ................................................ B23K 1/06
(52) U.S. Cl. ......................................................... 228/19
(58) Field of Search .............................. 228/110.1, 28, 228/180.5, 102, 4.5, 9, 1.1; 156/73.2; 219/56.21

(56) References Cited

U.S. PATENT DOCUMENTS

| | | |
|---|---|---|
| 3,125,803 A | 3/1964 | Rich |
| 3,224,072 A | 12/1965 | Summers et al. |
| 3,648,354 A | 3/1972 | Mashino et al. |
| 3,934,783 A | 1/1976 | Larrison |
| 4,597,520 A | 7/1986 | Biggs |
| 4,765,526 A * | 8/1988 | Sato .......................... 228/4.5 |
| 5,115,960 A | 5/1992 | Shimizu |
| 5,323,952 A | 6/1994 | Kato et al. |
| 5,425,491 A | 6/1995 | Tanaka |
| 5,443,200 A | 8/1995 | Arikado |

(List continued on next page.)

FOREIGN PATENT DOCUMENTS

| | | |
|---|---|---|
| JP | 54-038766 | 3/1979 |
| JP | 55-024403 | 2/1980 |
| JP | 61-101039 | 5/1986 |
| JP | 62-123728 | 5/1987 |
| JP | 03-114239 | 5/1991 |
| JP | 05-114629 | 5/1993 |
| JP | 05-326652 | 12/1993 |
| JP | 06-204278 | 7/1994 |
| JP | 2000-183100 | 6/2000 |

Primary Examiner—M. Alexandra Elve
Assistant Examiner—Jonathan Johnson
(74) Attorney, Agent, or Firm—Abdy Raissinia; Bracewell & Patterson, L.L.P.

(57) ABSTRACT

The present invention enhances the reliability of wire-bonding strength by reducing a variation in the entire transformation amount of a wire. At point P1, a bonding wedge 21 abuts the wire 71, whereby a load is exerted on the wire 71. The wire 71 transforms by an amount of transformation A, and the transformation stops at point P2. The transformation amount A varies greatly. At point P3 (T1), ultrasonic wave vibration is exerted and the transformation of the wire 71 is restarted. At this stage, a variation in the transformation amount A is absorbed by an amount of transformation B and therefore a variation in the transformation amount A+B becomes small. At point P4 (T1+T2), the transformation amount A+B is maintained substantially constant. At this point P4, the transformation amount of the wire 71 is set to 0 and the measurement of the transformation amount of the wire 71 is started. And until the transformation amount of the wire 71 reaches an amount of transformation C (point P5), a load and ultrasonic wave vibration are given.

2 Claims, 16 Drawing Sheets

U.S. PATENT DOCUMENTS

| | | | |
|---|---|---|---|
| 5,474,224 A | * 12/1995 | Nishimaki et al. | 228/102 |
| 5,586,713 A | 12/1996 | Arita et al. | |
| 5,884,835 A | * 3/1999 | Kajiwara et al. | 228/110.1 |
| 5,934,996 A | 8/1999 | Nagai et al. | |
| 5,984,162 A | 11/1999 | Hortaleza et al. | |
| 6,105,848 A | 8/2000 | Horibe et al. | |
| 6,135,341 A | 10/2000 | Falcone | |
| 6,237,833 B1 | * 5/2001 | Ikoma | 228/104 |
| 6,435,399 B2 | * 8/2002 | Ikoma | 228/104 |

* cited by examiner

| Number of Times of the Use of Bonding Wedge | Amount of Transformation, C' |
|---|---|
| 0 − 2499 | −1.2 |
| 2500 − 4999 | −1.0 |
| 5000 − 7499 | −0.8 |
| 7500 − 9999 | −0.6 |
| 10000 − 12499 | −0.4 |
| 12500 − 14999 | −0.2 |
| 15000 − 17499 | 0.0 |
| 17500 − 19999 | 0.2 |
| 20000 − 22499 | 0.4 |
| 22500 − 24999 | 0.6 |
| 25000 − 27499 | 0.8 |
| 27500 − 29999 | 1.0 |
| 30000 − 32499 | 1.2 |
| 32500 − 34999 | 1.4 |
| 35000 − 37499 | 1.6 |
| 37500 − 39999 | 1.8 |
| 40000 − 42499 | 2.0 |
| 42500 − | 2.2 |

*Fig. 12*

WIRE BONDING METHOD AND APPARATUS this is a division of application Ser. No. 09/629,789 filed Jul. 31, 2000 now abandoned.

BACKGROUND OF THE INVENTION

1. Technical Field

The present invention relates to a wire bonding method and apparatus which gives a load and ultrasonic wave vibration between a wire and a connection pad to bond the wire to the connection pad. More particularly, the present invention relates to a wire bonding method and apparatus that is capable of managing an amount of transformation of the wire so that stable bonding strength can be obtained.

2. Description of the Related Art

Wire bonding methods for giving a load and ultrasonic wave vibration between a wire and a connection pad to bond the wire to the connection pad, have been widely used in fabricating electronic components such as semiconductor chips. FIG. 14 is a diagram showing the a wire bonded to a connection pad, with FIG. 14A showing the front view and FIG. 14B showing the top view. In this wire bonding method, the wire 1 is placed on the connection pad 2, and a bonding wedge 3 is brought into contact with this wire 1. Then, a load is exerted downward by the bonding wedge 3, whereby the load is given between the wire 1 and the connection pad 2. Next, the bonding wedge 3 is given ultrasonic wave vibration in the direction of arrow L shown in FIG. 14A, whereby ultrasonic wave vibration is given between the wire 1 and the connection pad 2.

With the load and the ultrasonic wave vibration, the wire 1 (indicated by the dashed line) is forced downward and spreads on both sides, and the contacting areas of the wire 1 and the connection pad 2 are bonded with each other. The upper surface 1a of the wire 1 is flattened and the width in the longitudinal direction of the wire 1 becomes substantially constant. The width nw of the wire 1 after transformation is called nugget width.

There are two methods of managing a load and ultrasonic wave vibration which are given between the wire 1 and the connection pad 2: a method of managing the time of giving a load and ultrasonic wave vibration; and a method of managing the transformation amount of a wire which is forced in the direction of exerting a load. In general, even if the same load and the same ultrasonic wave vibration are given, the transformation amount of a wire will vary. For this reason, the method of managing the transformation amount of a wire is able to transform a wire with a higher degree of accuracy. The wire bonding method, which manages the transformation amount of a wire, is disclosed, for example, in a microfilm for Japanese Utility Model Application No. 56-22139 (Japanese Utility Model Laid-Open No. 57-135736).

FIG. 15 is a side view of the wire and the connection pad of FIG. 14 taken in the direction of arrow A shown in FIG. 14. In the wire bonding method which manages the transformation amount of a wire, the movement quantity of the bonding wedge 3 is considered to be the transformation amount of the wire 1, and the movement quantity of the bonding wedge 3 is measured. Although the transformation amount of the wire 1 is ideal to measure the entire transformation amount c, practically an amount of transformation b is measured. An amount of transformation a indicates the quantity that the wire 1 is slightly transformed by the load exerted via the bonding wedge 3 when the bonding wedge 3 moving downward is brought into contact with the wire 1. This amount of transformation a is outside the management of the transformation amount of a wire.

A conventional wire bonding apparatus uses, for is example, the dead load of a horn (not shown), which supports the bonding wedge 3, to exert the load to the wire 1. If the bonding wedge 3 is lowered and brought into contact with the wire 1, the wire 1 is transformed in a moment. For this reason, it is difficult to set an amount of transformation to zero (initial value) by grasping the moment that the bonding wedge 3 is brought into contact with the wire 1. For this reason, this apparatus sets a time period enough for the bonding wedge 3 to abut and transform the wire 1 from the time when the bonding wedge 3 is lowered. At the time that the set time period has elapsed since the bonding wedge 3 was lowered, ultrasonic wave vibration is applied, and at the same time, the transformation amount of the wire is set to 0. In this way, the amount of transformation b is measured.

However, the conventional wire bonding method and apparatus, which manage the transformation amount of a wire, has the disadvantage that the entire transformation amount of the wire 1 will vary greatly, although the amount of transformation b is accurately managed to exert the load and ultrasonic wave vibration between the wire 1 and the connection pad 2.

It is considered that the variation in the entire transformation amount of the wire results from variations in the positional accuracy of setting works (connection pads and wires), the wire diameter, the thickness of the connection pad, the speed (shock load) at which the bonding wedge 3 abuts, and the like. However, after all, the variation in the transformation amount of the wire is due to the amount of transformation a, which is outside the management.

When transformation a1 is small, as shown in FIG. 16A, the entire transformation amount c1 of the wire 1 becomes c1=a1+b. When transformation a2 is large, as shown in FIG. 16B, the entire transformation amount c2 of the wire 1 becomes c2=a2+b. The difference Da between the quantities of transformation a1 and a2, as it is, becomes the difference Dc between the quantities of transformation c1 and c2.

The present invention has been made in order to solve the aforementioned problems. Accordingly, the object of the present invention is to provide a wire bonding method and a wire bonding apparatus which reduces a variation in the entire transformation amount of a wire to enhance the reliability of the wire-bonding strength.

SUMMARY OF THE INVENTION

In accordance with one aspect of the present invention, there is provided a wire bonding method for bonding wires to connection pads, comprising: a loading step for transforming the wires by touching the wires to a bonding wedge to apply a predetermined load between the wires and connection pads; a time controlling step for providing a predetermined ultrasonic wave vibration with the predetermined load for a predetermined time through the bonding wedge after transforming the wires in the loading step; and a transformation amount controlling step for providing the predetermined ultrasonic wave vibration with the predetermined load between the wires and connection pads, while measuring an amount of wire transformation until the amount of wire transformation reaches a predetermined set value, the amount of wire transformation being set at an initial value, the transformation being directed to the loading after wearing the predetermined time in the time controlling step.

In accordance with another aspect of the present invention, there is provided a wire bonding apparatus for bonding wires to connection pads, comprising: load applying means for touching the wires to a bonding wedge to apply a predetermined load between the wires and connection pads; ultrasonic wave vibration providing means for providing a predetermined ultrasonic wave vibration between the wires and connection pads through the bonding wedge; transformation amount measuring means for measuring an amount of wire transformation; and control means for controlling operation of the load applying means, the ultrasonic wave vibration providing means and the transformation amount measuring means; wherein the control means performs control so that: first, the load applying means touches the wires to the bonding wedge, applies the predetermined load between the wires and connection pads through the bonding wedge, and transforms the wires; then, the load applying means applies the predetermined load for a predetermined time, and at the same time, the ultrasonic wave vibration providing means provides the predetermined ultrasonic wave vibration for the predetermined time; after the predetermined time, the transformation amount measuring means sets the amount of wire transformation at an initial value, and the ultrasonic wave vibration providing means provides the predetermined ultrasonic wave vibration, while the predetermined load is being applied by the load applying means, until the amount of wire transformation measured by the transformation amount measuring means reaches a predetermined set value.

BRIEF DESCRIPTION OF THE DRAWINGS

FIG. 12 is a diagram showing the transformation-amount setting table shown in FIG. 11;

DETAILED DESCRIPTION OF THE PREFERRED EMBODIMENT

Preferred embodiments of a wire bonding method and apparatus according to the present invention will hereinafter be described with reference to the drawings.

First Embodiment

Figure 1:
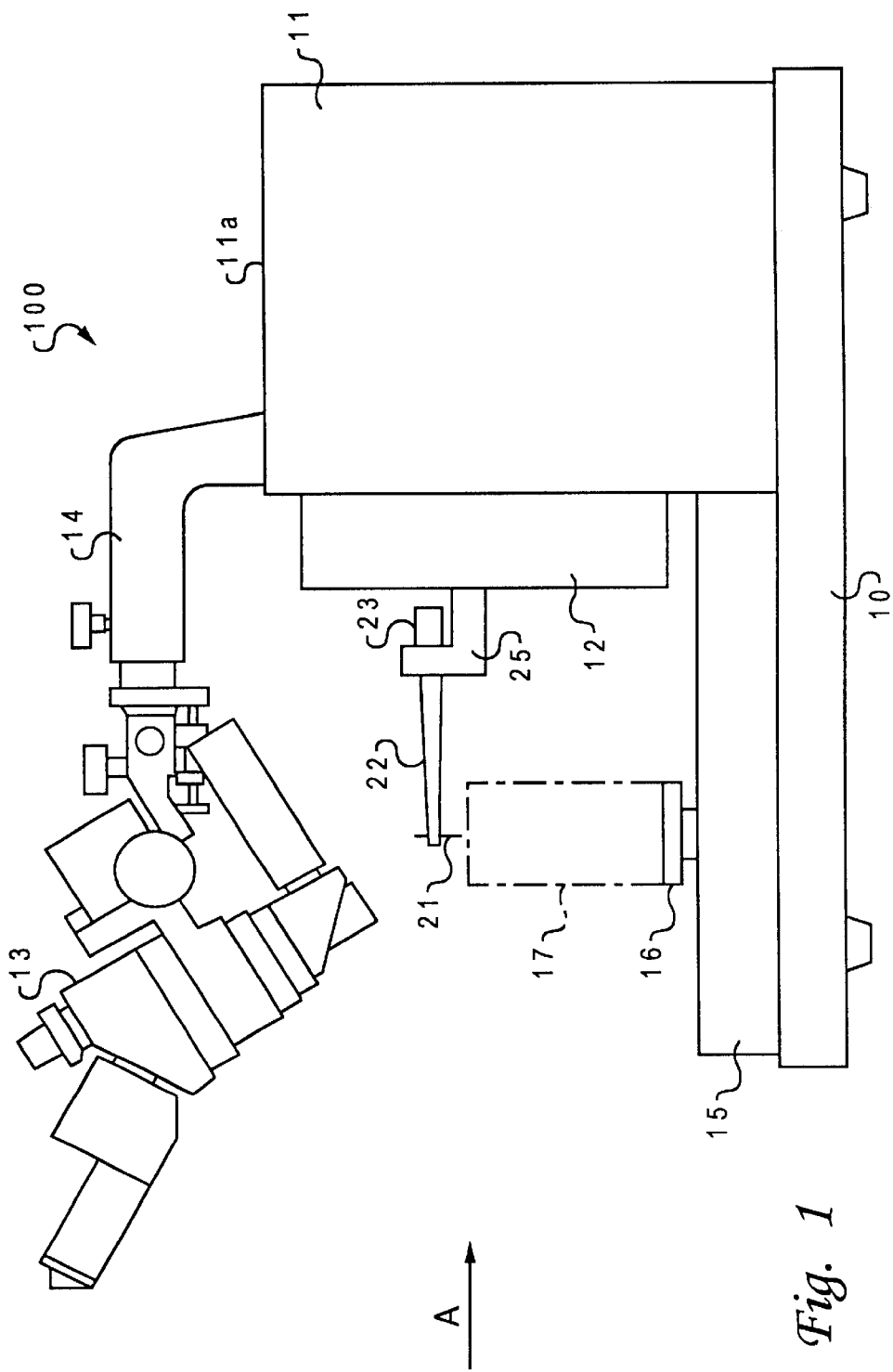
FIG. 1 is a schematic diagram showing the construction of an ultrasonic bonder according to a first embodiment of this invention.

FIG. 1 is a schematic diagram of an ultrasonic bonder according to a first embodiment of this invention. The directions in this ultrasonic bonder 100 will be expressed by the direction of the bonder 100 viewed in the direction of arrow A in FIG. 1. For instance, the left side in FIG. 1 is referred to as front side or this side, and the right side is referred to rear side or depth side. In other figures, these expressions will also be used.

In FIG. 1, control means 11 with the control circuit 200 (not shown) of the ultrasonic bonder 100 is provided on the depth side of a bed 10. An Y-table 15 movable in the right-and-left direction is provided on this side of the bed 10, and an X-table 16 movable in the fore-and-aft direction is provided on the Y-table 15. A work 17 is mounted on this X-table 16.

Above the work 17 mounted on the X-table 16, there is provided a horn 22 which has a bonding wedge 21 attached to its front end portion. The horn 22 extends in the fore-and-aft direction. The rear end of the horn 22 is connected to an ultrasonic vibrator 23, which is in turn supported on a support member 25. These constitute an ultrasonic-vibration drive section 12. The ultrasonic-vibration drive section 12 is provided on the central portion on the front side of the control means 11.

Above this side of the ultrasonic bonder 100, a microscope 13 is supported by a support arm 14. The support arm 14 is mounted on the front portion of the upper surface 11a of the control means 11. The operation of bonding a wire to the work 17 is performed below the microscope 13.

Figure 2:
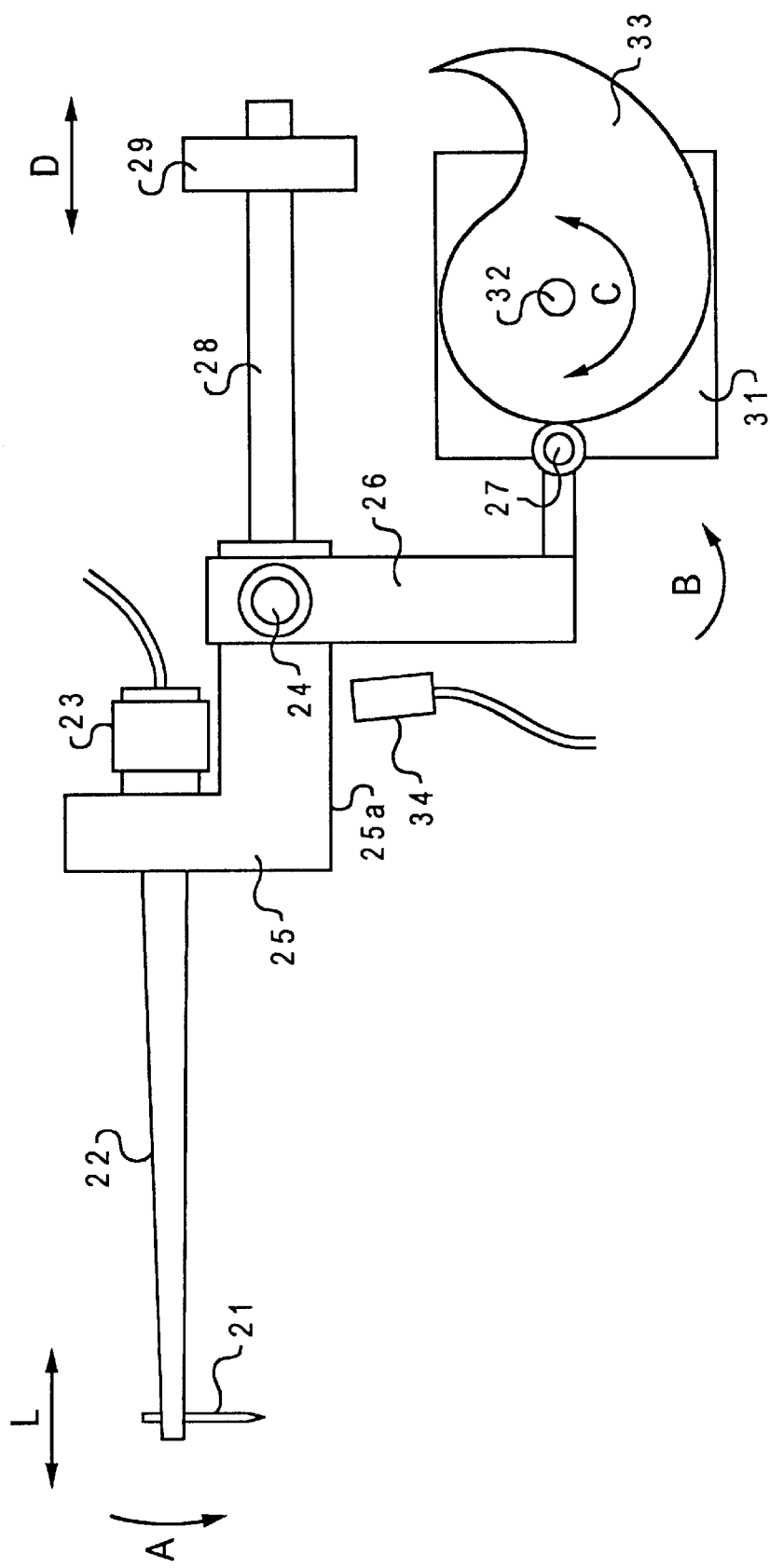
FIG. 2 is a diagram showing the construction of the ultrasonic-vibration drive section shown in FIG. 1.

FIG. 2 is a diagram showing the construction of the ultrasonic-vibration drive section shown in FIG. 1. As described supra, the bonding wedge 21 is attached to the front end portion of the horn 22. The rear end of the horn 22 is connected to the ultrasonic vibrator 23, which is in turn supported on one side of the L-shaped support member 25. On the side surface of the other side of the L-shaped support member 25, the side surface of one end of an L-shaped link member 26 that extends downward is mounted. The support member 25 and the link member 26 are supported on a pivot shaft 24 fixed to the main body of the ultrasonic bonder 100 and rotate as one body on the pivot shaft 24. On the other end of the L-shaped link member 26, there is provided a wheel 27 which rotates along a cam 33.

The cam 33 is supported on the driving shaft 32 of a cam driving motor 31 mounted on the main body of the ultrasonic bonder 100. The cam driving motor 31 rotates the cam 33 via the driving shaft 32 in the directions of arrow C shown in FIG. 2. A shaft member 28 is provided on the other end of the support member 25. The shaft member 28 is provided with a balancer 29 movable in the directions of arrow D shown in FIG. 2.

The front end portion of the horn 22 with the bonding wedge 21 attached thereto tries to rotate on the pivot shaft 24 in the direction of arrow A in FIG. 2 by the dead loads of the horn 22, the support member 25 and the like. During the stand-by state of the ultrasonic bonder 100, the wheel 27 provided on the other end of the link member 26 abuts the cam 33, whereby the positions of the horn 22, the support member 25 and the link member 26 are regulated.

During the operation of the ultrasonic bonder 100, the cam 33 is driven by the cam driving motor 31, and the cam 33 rotates in the direction in which the radius becomes small. As a result, the link member 26 rotates in the direction of arrow B shown in FIG. 2, and the 25 front end portion of the horn 22 rotates in the direction of arrow A. In this way, the bonding wedge 21 is lowered. If the cam 33 further rotates, the bonding wedge 21 abuts the work 17 shown in FIG. 1 and therefore a load is exerted on the work 17 by the dead loads of the horn 22, the support member 25 and the like. At this time, the wheel 27 provided on the other end of the link member 26 is positioned near the cam 33. The load to exerted on the work 17 is adjusted in advance by the balancer 29 movable in the direction of arrow D with respect to the shaft member 28.

In addition, during the operation of the ultrasonic bonder 100, ultrasonic wave vibration is issued by the ultrasonic vibrator 23. This ultrasonic wave vibration is amplified by the horn 22 and transmitted to the front end portion of the horn 22. The front end portion of the horn 22 vibrates in the direction of arrow L in FIG. 2, whereby the bonding wedge 21 vibrates.

A displacement sensor 34, mounted on the main body of the ultrasonic bonder 100, is provided under the lower surface 25a of the support member 25. The displacement sensor 34 is constructed, for example, of an electrostatic capacity type of non-contact displacement sensor and senses a gap length between it and the lower surface 25a of the support member 25. The displacement sensor 34 is used to measure the quantity of movement that the lower surface 25a of the support member 25 moves downward. The quantity of movement that the bonding wedge 21 moves downward is calculated from the quantity of movement measured by the displacement sensor 34.

Figure 3:
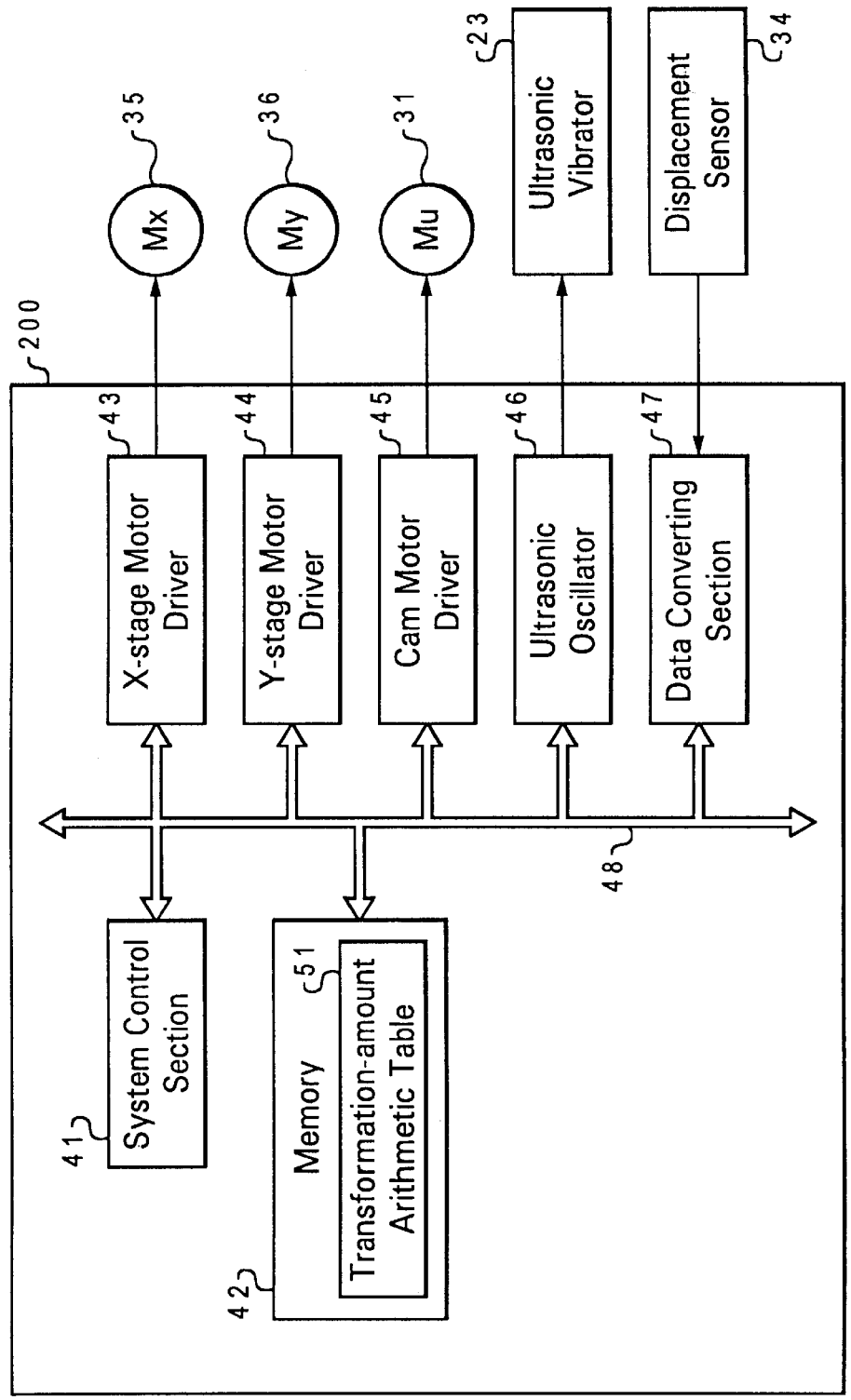
FIG. 3 is a schematic diagram showing the construction of the control circuit of the ultrasonic bonder shown in FIG. 1.

FIG. 3 shows the schematic construction of the control circuit of the ultrasonic bonder shown in FIG. 1. The control circuit 200, as shown in FIG. 3, is equipped with system control means 41, memory 42, an X-stage motor driver 43, an Y-stage motor driver 44, a cam motor driver 45, an ultrasonic oscillator 46, and a data converting section 47. These are interconnected by a bus 48.

The system control means 41 controls the entirety of the ultrasonic bonder 100, based on programs, data and the like stored in the memory 42. The memory 42 is constructed of a read-only memory (ROM), a random access memory (RAM) and the like. The X-stage motor driver 43 is a drive circuit that drives an X-table driving motor 35 for moving the X-table 16. The Y-stage motor driver 44 is a drive circuit that drives an Y-table driving motor 36 for moving the Y-table 15. The cam motor driver 45 is a drive circuit which drives a cam driving motor 31.

The ultrasonic oscillator 46 is a drive circuit that applies voltage to an ultrasonic vibrator 23 to vibrate the vibrator 23 at a predetermined oscillation frequency. Note that an oscillation frequency is arbitrarily settable. The data converting section 47 converts a detection signal (analog signal) sensed by the displacement sensor 34 to digital data.

The memory 42 stores a transformation-amount arithmetic table 51. The transformation-amount arithmetic table 51 correlates the movement quantity of the lower surface 25a of the support member 25, sensed by the displacement sensor 34 and converted to digital data by the data converting section 47, with the movement quantity of the bonding wedge 21. The system control means 41 calculates the movement quantity of the bonding wedge 21 that corresponds to the movement quantity of the lower surface 25a of the support member 25 output from the data converting section 47, by making reference to the transformation-amount arithmetic table 51. This movement quantity of the bonding wedge 21 means the transformation amount of a wire.

Figure 4:
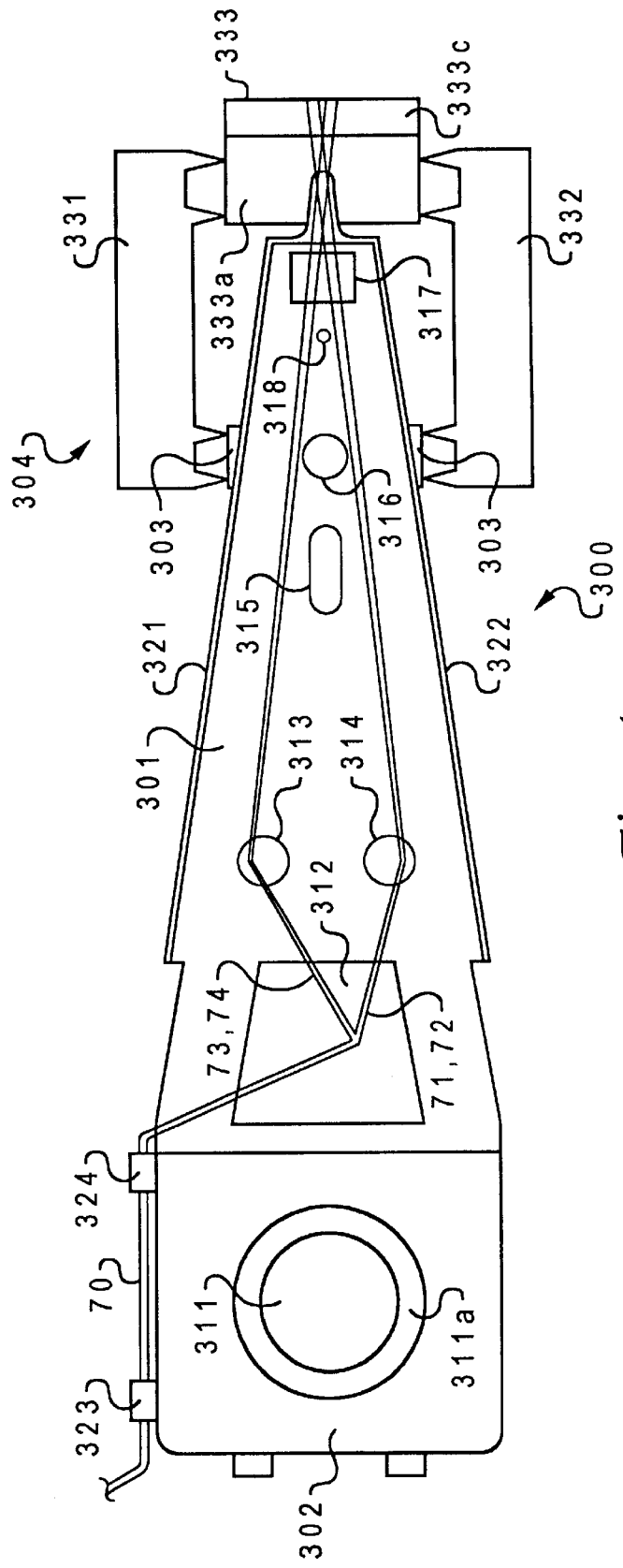
FIG. 4 is a schematic-diagram showing the construction of a suspension arm.
Figure 5:
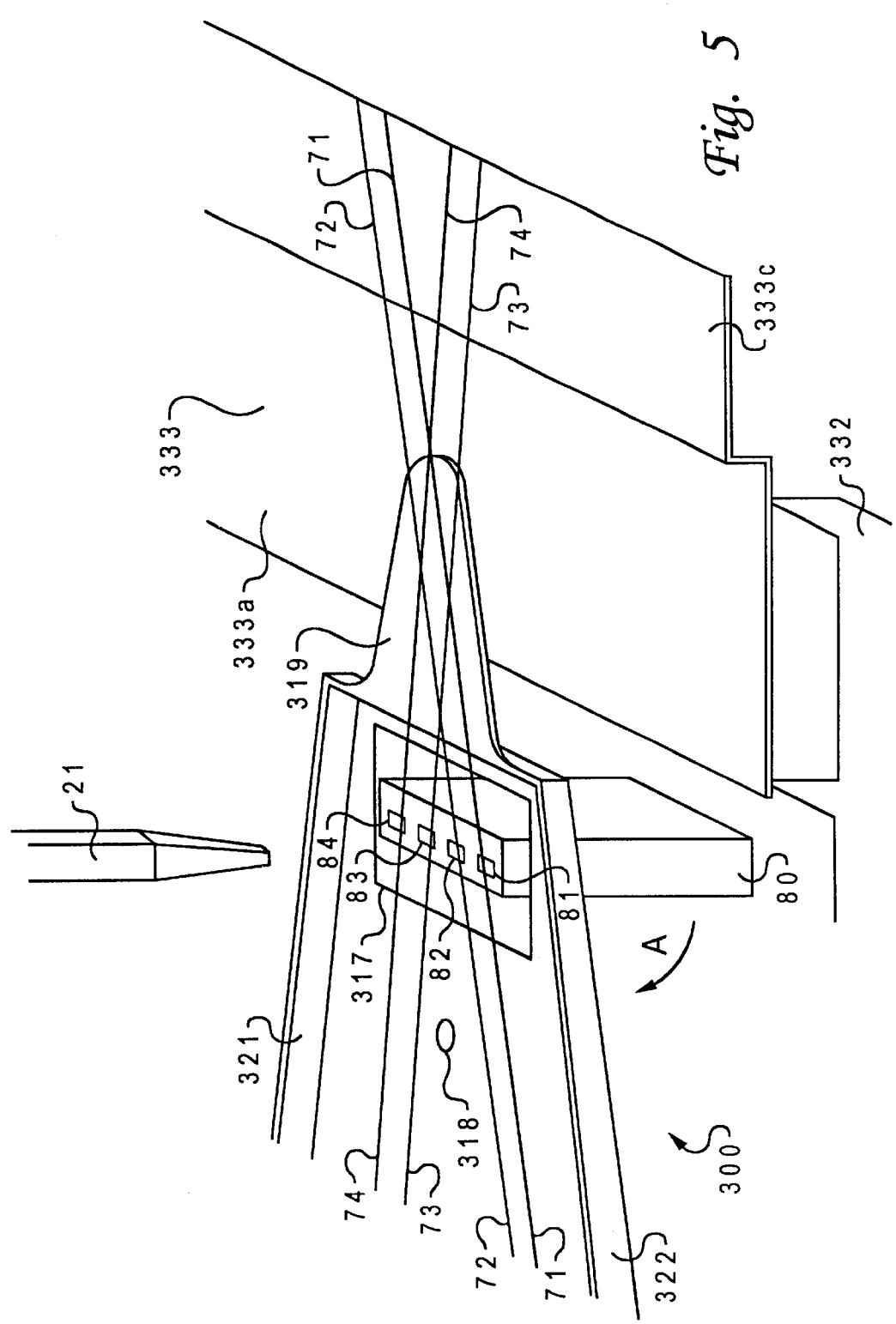
FIG. 5 is a diagram showing a wire bonding method for a HSA.

The ultrasonic bonder 100 is used, for example, in assembling a head suspension assembly(HSA) which is used in a hard-disk drive (HDD) unit. FIG. 4 is a schematic diagram showing the construction of a suspension arm, and FIG. 5 is a diagram showing a wire bonding method for a HSA.

The HSA is provided with a head slider 80 (FIG. 5), which has magnetic read and write heads, at the point end portion of a suspension arm 300. The HSA mounts wires 71 to 74, which electrically connect these magnetic heads with a hard-disk controller, on the suspension arm 300.

The HSA is attached to the actuator of the HDD unit and rotates on a plane parallel with the recording surface of the magnetic disk. The rotation of the HSA causes the magnetic read and write heads to move nearly in the radial direction of the magnetic disk, whereby data at any position on the recording surface of the magnetic disk is accessed.

The suspension arm 300, as shown in FIG. 4, is constructed by integrally stacking a load beam 301, a base plate 302, and a flexure 303. The suspension assembly 300 is approximately symmetrically formed with respect to a center axis (not shown).

The load beam 301 is formed from stainless steel with a thickness of about 0.05 mm. The rear end portion of the load beam 301 is formed into approximately a rectangle, while the point end portion is formed such that the width becomes smaller as it goes toward the point end.

On the upper surface of the rear end portion of the load beam 301, the base plate 302 of nearly the same configuration as this rear end portion is stacked. The base plate 302 is constructed from stainless steel about 0.02 mm in thickness (excluding a boss 311a). The load beam 301 and the base plate 302 are integrally formed at a plurality of points by spot welding.

The load beam 301 and the base plate 302 are provided with an attaching hole 311 which is attached to the actuator. A reinforcing boss 311a is provided around the attaching hole 311. The load beam 301 is provided with an opening 312 for giving elasticity to the load beam 301. The load beam 301 is also provided with holes 313, 314, 315, 316, and 317 in order to reduce the weight of the load beam 301. These holes are used in assembling the HSA.

The hole 317 is provided for bonding the wires 71 to 74 to the bonding pads 81 to 84 (FIG. 5) of the head slider 80. A gimbal pivot 318 which projects downward is provided behind the hole 317. The load beam 301 is provided-at both side portions with ribs 321 and 322 for ensuring the rigidity of the load beam 301. Caulking portions 323 and 324 are provided on one side of the rear end portion of the load beam 301.

The flexure 303 is provided on the lower surface of the point end portion of the load beam 301. The flexure 303 is constructed of stainless steel with a thickness of about 0.02 mm. The rear end of the flexure 303 is formed integrally with the load beam 200 by adhesion or spot welding. The point end of the flexure 303 abuts the gimbal pivot 318 of the load beam 301 and is supported at one point by the gimbal pivot 318. As described infra, the head slider 80 is glued to the lower surface of the point end portion of the flexure 303. With this arrangement, the head slider 80 is supported at one point on the gimbal pivot 317 through the flexure 303 and becomes slightly tiltable in any direction.

A tub frame 304 is provided on the point end side of the load beam 301 and constructed of an A-side frame 331, a B-side frame 332, and a C-side frame 333 disposed to enclose the circumference of the load beam 301. The tub frame 304 is formed integrally with the flexure 303. The A-side frame 331 is connected at two points with the flexure 303 and is also connected at two points with the C-side frame 333. The B-side frame 332 is connected at two points with the flexure 303 and is also connected at two points with the C-side frame 333. The reason why they are thus connected at points is for facilitating disconnecting them from one another.

The C-side frame 333 is equipped with a first plane portion 333a to which the A-side frame 331 and the B-side frame 332 are connected, a stepped portion 333b bent at substantially a right angle to the first plane portion 333a to form a stepped portion, and a second plane portion 333c (FIG. 5) bent at substantially a right angle to the stepped portion 333b. The first plane portion 333a is provided on nearly the same plane as the flexure 303. On the other hand, the second plane portion 333c is provided on nearly the same plane as the merge lip 319 of the load beam 301.

The wires 71 to 74 are bundled by tube 70 and caulked by the caulking portions 323 and 324 of the load beam 301. The wires 71 to 74 are led from the rear end of the load beam 301 to the point end, while they are is being fixed at predetermined positions on the load beam 301 by an adhesive agent. The wires 71 to 74 are divided at the opening 312 into wires 71, 72 and wires 73, 74 and are led from the rear end of the suspension arm 300 to the point end approximately symmetrically with respect to the center axis of the suspension arm 300. The wires 71 and 72 are separately divided at the hole 313, while the wires 73 and 74 are separately divided at the hole 314. The wires 71 to 74 pass over the hole 317 of the load beam 301; cross one another at the merge lip 319; and are led to the second plane portion 333c of the C-side frame 333. The wires 71 to 74 are mounted on the second plane portion 333c by means of an adhesive agent.

The suspension arm 300 with the wires 71 to 74 mounted thereon are inserted in a jig (not shown) along with the, head slider 80. This jig not shown is mounted on the X-table 16 of the ultrasonic bonder 100 shown in FIG. 1. This jig is mounted on the X-table 16 at a position where the detachment becomes easy. Thereafter, the Y-table 15 and the X-table 16 move so that the hole 317 of the load beam 301 is positioned under the bonding wedge 21.

The suspension arm 300, as shown in FIG. 5, is horizontally supported on the jig (not shown). The head slider 80, on the other hand, is vertically stood and is supported such that a portion thereof penetrates the hole 317 of the suspension arm 300 (load beam 301). Bonding pads 81 to 84 are disposed on the upper surface of the head slider 80 at regular intervals. The wires 71 to 74 are disposed in contact with or in close proximity to the bonding pads 81 to 84 to be bonded. Any of the wires 71 to 74 is positioned under the bonding wedge 21, and the corresponding pad on the head slider 80 is positioned under the wire.

In bonding a wire, the bonding wedge 21 moves downward and abuts, for example, the wire 71. The wire 71 is pushed against the bonding pad 81. In this way, a predetermined load is given between the wire 71 and the bonding pad 81. Then, the ultrasonic vibrator 23 shown in FIG. 2 produces ultrasonic wave vibration, based on a drive signal from the ultrasonic oscillator 46 shown in FIG. 3. The bonding wedge 21 vibrates in a direction (fore-and-aft direction of the ultrasonic bonder 100) parallel with the center axis of the suspension arm 300.

The bonding pads 81 to 84 on the head slider 80 are each constructed by coating the surface of copper with gold, and each bonding surface is formed into a 0.1 to 0.2 mm square. The wires 71 to 74 have a three-layer construction, in which a copper wire is coated with gold and then the coating of gold is covered with an insulator. In the bonding portion of each of the wires 71 to 74, the insulating film of the outmost layer is removed so that the gold layer is exposed. The wire diameter of this bonding portion is 30 to 50 mm.

If the wire bonding operation for the wires 71 to 74 ends, the point portions of the wires 71 to 74 beyond the bonding pads 81 to 84 are cut off. The tub frame 304 is cut off from the flexure 303, because the tub frame 304 has ended the role of positioning the wires 71 to 74. The head slider 80 is rotated in the direction of arrow A shown in FIG. 5 and glued to the lower surface of the flexure 303. The wires 71 to 74 bonded to the bonding pads 81 to 84 are bent downward by the rotation of the head slider 80.

Now, a description will be given of the wire bonding method in the first embodiment. Trial-and-error testing has been made in order to reduce a variation in the transformation amount of the wire and it has been confirmed that the speed of transforming wire (transformation amount/unit time) becomes lower with the lapse of time. If ultrasonic wave vibration is given between the wire and the bonding pad, the wire will rapidly be forced and then the amount of the crash will gradually be reduced.

Furthermore, trial-and-error testing has been made and it has been confirmed that, depending on a difference in the wire transformation amount A when the bonding wedge 21 is caused to move downward and abut the wire, the wire transforming speed, which is obtained when ultrasonic wave vibration is given after the wire transformation amount A, varies. If the bonding wedge 21 is caused to move downward and abut the wire, the wire is slightly transformed by the load exerted via the bonding wedge 21. This transformation amount A varies greatly and is considered to be due to major causes such as positional accuracy for setting works (connection pads and wires), the speed at which the bonding wedge abuts the wire (shock load) and the like.

In the case where the transformation amount A of the wire is small, if ultrasonic wave vibration is given, the wire will start transforming rapidly. On the other hand, in the case where the transformation amount A of the wire is large, if ultrasonic wave vibration is given, the wire will start transforming slowly. From this fact it is considered that, at the time a certain time period (sufficiently shorter than bonding time) has elapsed since ultrasonic wave vibration was given, a variation of the wire transformation amount A is absorbed and the entire transformation amount of the wire becomes constant. Hence, the wire bonding method in the first embodiment manages a time period, during which a load and ultrasonic wave vibration are given between the wire and the connection pad, until a certain time period has elapsed since the ultrasonic wave vibration was given. After the certain time period has elapsed, the wire bonding method manages the transformation amount of the wire that is forced in the direction in which the load is exerted.

Figure 6:
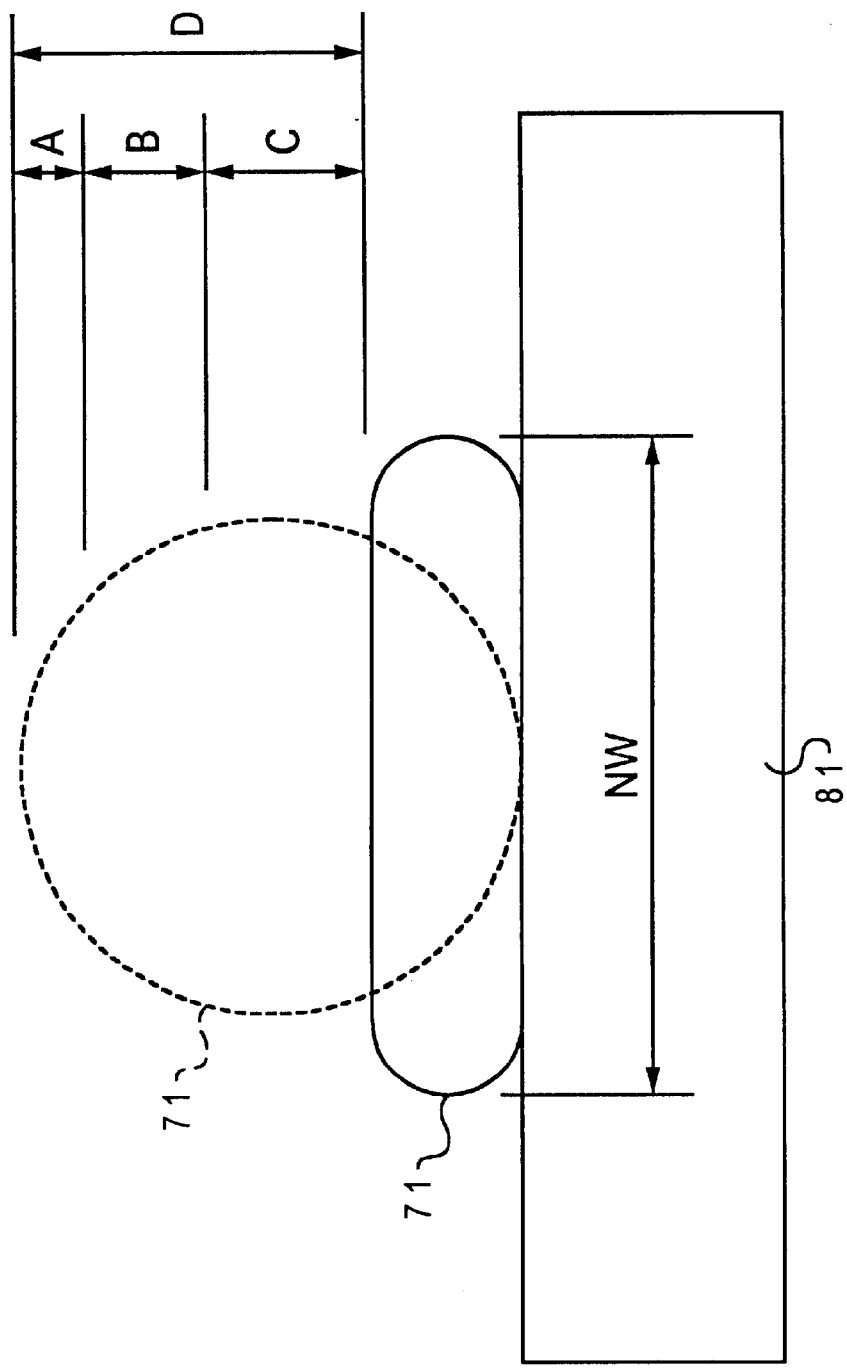
FIG. 6 is a diagram showing the wire bonding method of the first embodiment.

FIG. 6 is a diagram showing the wire bonding method of the first embodiment. For instance, assume that the wire 71 is pushed against the bonding pad 81 by the bonding wedge 21 so that a predetermined load and a predetermined ultrasonic wave vibration are given between the wire 71 and the bonding pad 81, as shown in FIG. 6. In this wire bonding method, the entire transformation amount D of the wire 71 is divided into transformation quantities A, B, and C.

The transformation amount A indicates the quantity that the wire 71 transforms slightly by the load exerted via the bonding wedge 21 when the bonding wedge 21 abuts the wire 71. As described supra, this transformation amount A varies greatly. This transformation amount A is not measured. For this reason, time T1 enough for the bonding wedge 21 to abut and transform the wire 71 from the start of the downward movement of the bonding wedge 21 is set in advance. If this set time T1 elapses from the start of the downward movement of the bonding wedge 21, ultrasonic wave vibration is given via the bonding wedge 21.

The transformation amount B indicates the quantity that the wire 71 transforms until time T2 elapses from the time when ultrasonic wave vibration is given through the bonding wedge 21. The time T2 is previously set, since a variation in the aforementioned transformation amount A is absorbed during the time T2. When the transformation amount A is small, the transformation amount B becomes large, and when the transformation amount A is large, the transformation amount B becomes small. The transformation amount A+B, therefore, is kept substantially constant.

The transformation amount C is managed by the ultrasonic bonder 100. If time T2 elapses, the transformation amount of the wire 71 is set to 0 and the measurement of the transformation amount of the wire 71 is started. And until a transformation amount to be measured reaches the preset transformation amount C, a predetermined load and ultrasonic wave vibration are given via the bonding wedge 21.

This transformation amount is measured by the displacement sensor 34 shown in FIG. 2. The movement quantity of the lower surface 25a of the support member 25 sensed by the displacement sensor 34 is converted to digital data by the data converting section 47. And the system control means 41 obtains the movement quantity of the bonding wedge 21 (i.e., the transformation amount of the wire) corresponding to the movement quantity of the lower surface 25a of the support member 25, by making is reference to the transformation-amount arithmetic table 51 stored in the memory 42.

Figure 7:
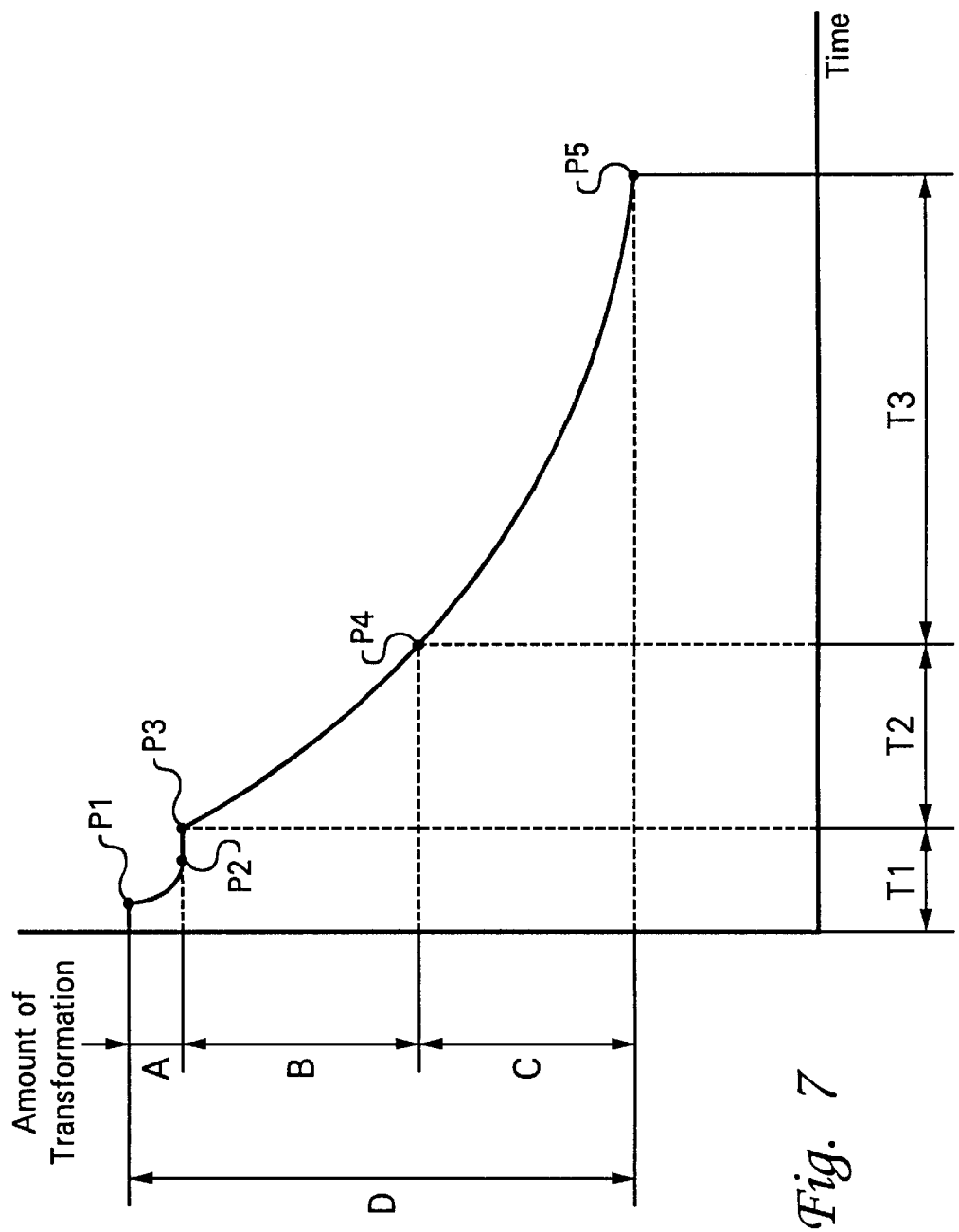
FIG. 7 is a timing diagram showing the wire bonding method of the first embodiment.

FIG. 7 is a timing diagram showing the wire bonding method of the first embodiment. FIG. 7 schematically shows the relation between the transformation amount of the wire and the bonding time. This bonding method includes a loading step, a time managing step, and a transformation-amount managing step. The loading step corresponds to transformation amount A (variable) and time T1 (fixed). The time managing step corresponds to transformation amount B (variable) and time T2 (fixed). The transformation-amount managing step corresponds to transformation amount C (fixed) and time T3 (variable).

At point P1, the bonding wedge 21 abuts the wire 71, whereby a load is exerted on the wire 71. With this load, the wire 71 transforms by the transformation amount A, and the transformation stops at point P2. The transformation amount A varies greatly. At point P3 that the time T1 elapses, ultrasonic wave vibration is then exerted and the transformation of the wire 71 is restarted. At this stage, a variation in the transformation amount A is absorbed by the transformation amount B and therefore a variation in the transformation amount A+B become small. At point P4 that time T1+T2 elapses, the transformation amount A+B is maintained substantially constant. At this point P4, the transformation amount of the wire 71 is set to 0 and the measurement of the transformation amount of the wire 71 is started. And until the transformation amount of the wire 71 to be measured reaches the transformation amount C (point P5), a predetermined load and a predetermined ultrasonic wave vibration are given. In this way, the transformation amount A+B is kept substantially constant at point P4, so that the entire transformation amount D (=A+B+C) is also kept substantially constant.

It is preferable that time T2 be in the order of tens of msec. If time T2 is shorter than this, a variation in the transformation amount A can not be sufficiently absorbed. If time T2 is longer than tens of msec, a variation in the transformation amount A is absorbed, and furthermore, a variation occurs in the transformation amount B. For this reason, a variation in the transformation amount A+B will become great again. Note that time T3 corresponding to the transformation amount C is in the order of 100 to 300 msec and a great variation is recognized.

Figure 8:
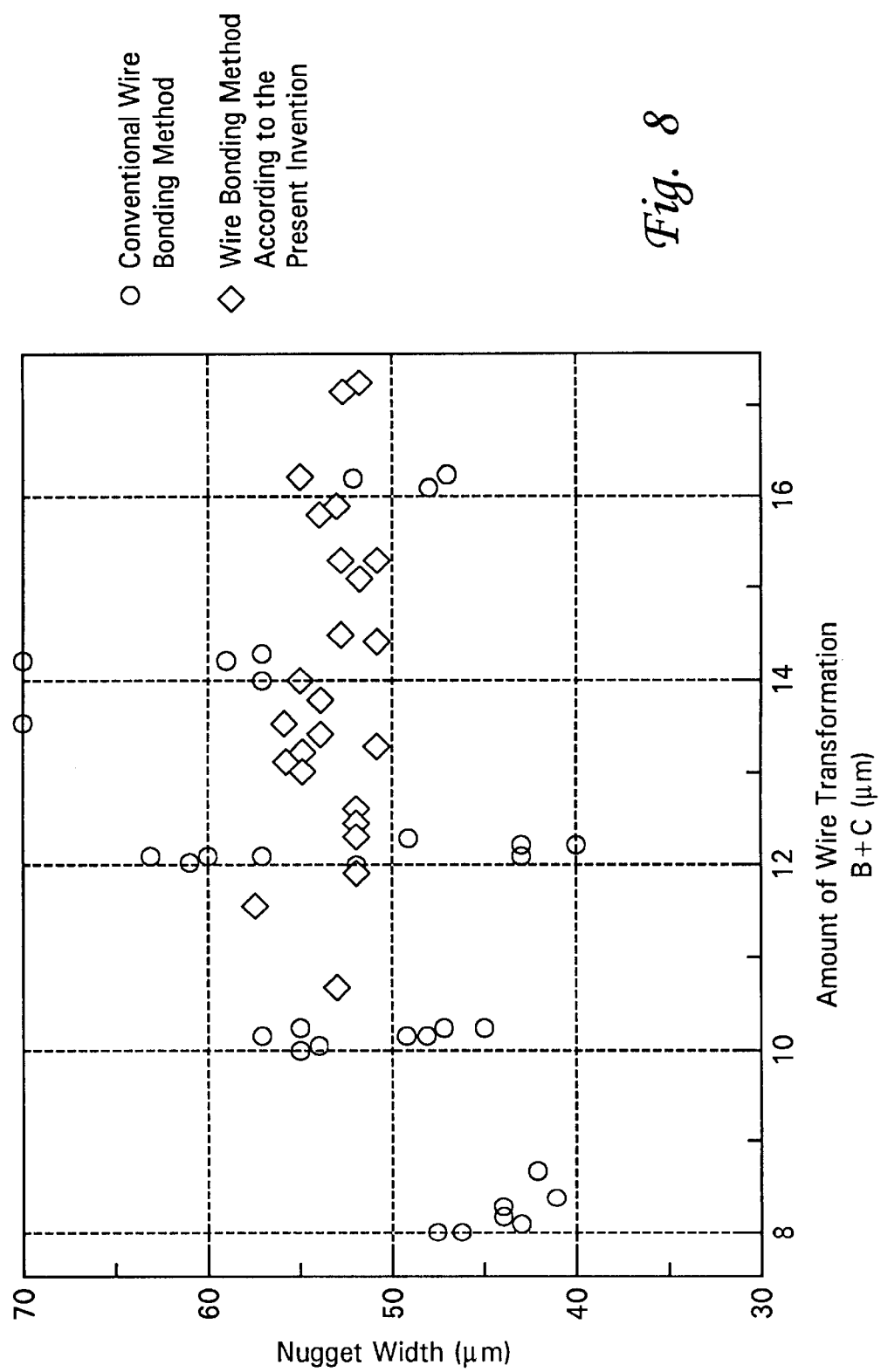
FIG. 8 is a diagram showing an example of the comparison of a variation in the nugget width of the wire between a conventional wire bonding method and the wire bonding method of the present invention.

FIG. 8 is a diagram showing an example of the comparison of a variation in the nugget width of the wire between a conventional wire bonding method and the wire bonding method of the present invention. The transformation amount D of the wire, nugget width NW, and wire-bonding strength are in a close relationship. If the transformation amount D of the wire is too small, the nugget width NW will become small and therefore the bonding area with the bonding pad will become small. For this reason, the wire-bonding strength is reduced. On the other hand, if the transformation amount D of the wire is too large, the nugget width NW will become large and therefore the bonding area with the bonding pad will become large. For this reason, a crack will occur in the boundary portion (heel portion) between a transformed portion and an untransformed portion or in a flat bonding surface, and consequently, the wire-bonding strength will be reduced.

Figure 15:
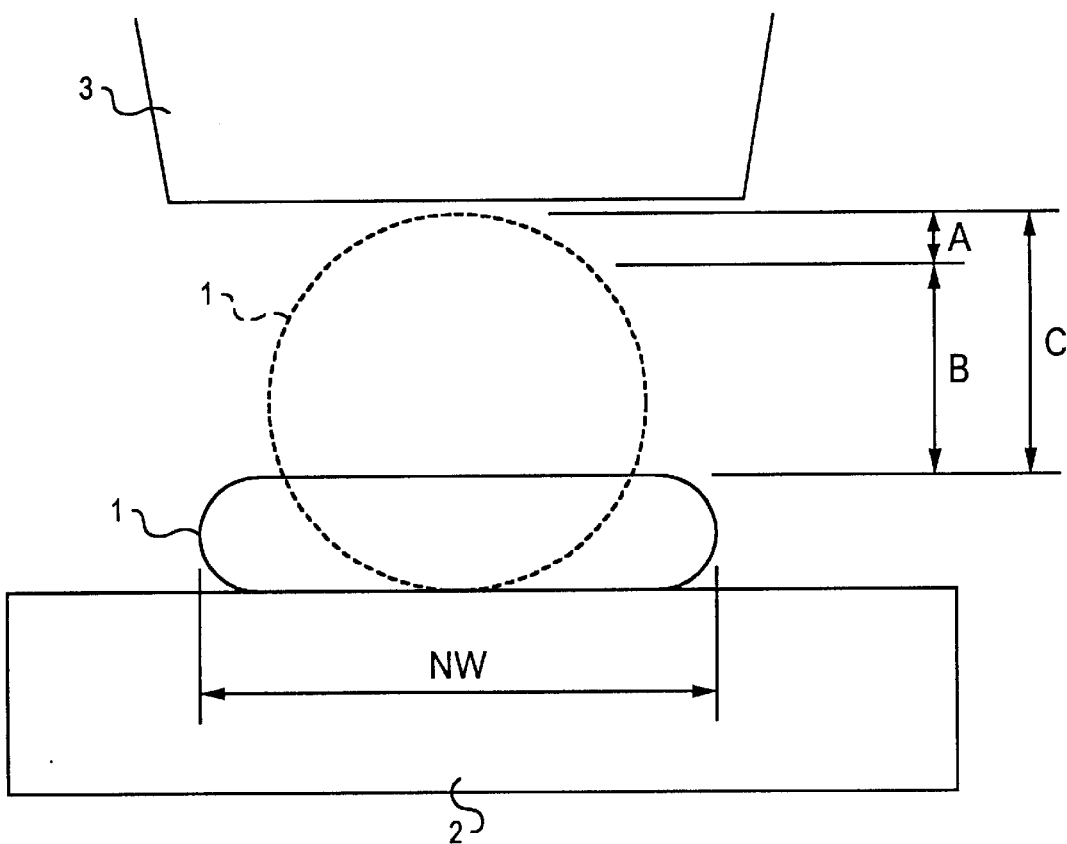
FIG. 15 is a side view of the wire and the connection pad shown in FIG. 14.
Figure 16B:
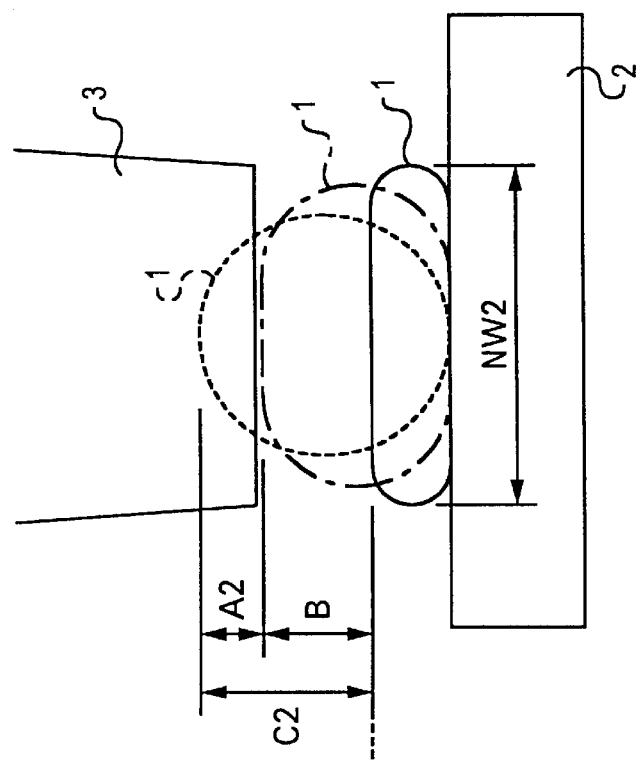
FIG. 16 is a diagram showing the relationship between quantities of transformation a and c.
Figure 16A:
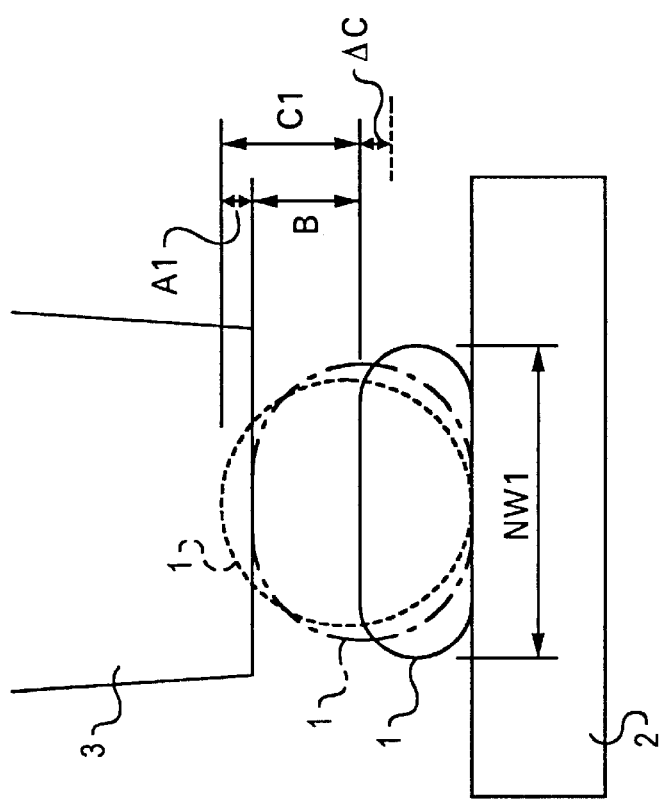

The wire bonding method of the present invention and a conventional wire bonding method are compared from the relation between a transformation amount and a nugget width. It is assumed that:

Wire diameter: 36 mm
Time T2 in the present invention: 20 msec
Transformation amount C in present invention: 9 mm
Conventional transformation amount b: 8, 10, 12, 14, 16 mm (Transformation amount b: refer to FIG. 15) A variation in the nugget width NW is checked by varying the loading condition for abutting the bonding wedge 21 with the wire 71. Note that in the ultrasonic bonder 100, the transformation amount B is also measurable. In FIG. 8, therefore, the transformation amount B+C is used.

As will be seen from FIG. 8, in the conventional wire bonding method, the nugget width nw will vary greatly if the loading condition is varied. On the other hand, in the wire bonding method according to the present invention, the transformation amount B+C includes the transformation amount B and therefore spreads in the lateral direction. From this fact it follows that the transformation amount B varies greatly. However, the nugget width NW is very stable because it is within a range of 50 to 60 mm.

Second Embodiment

Figure 9:
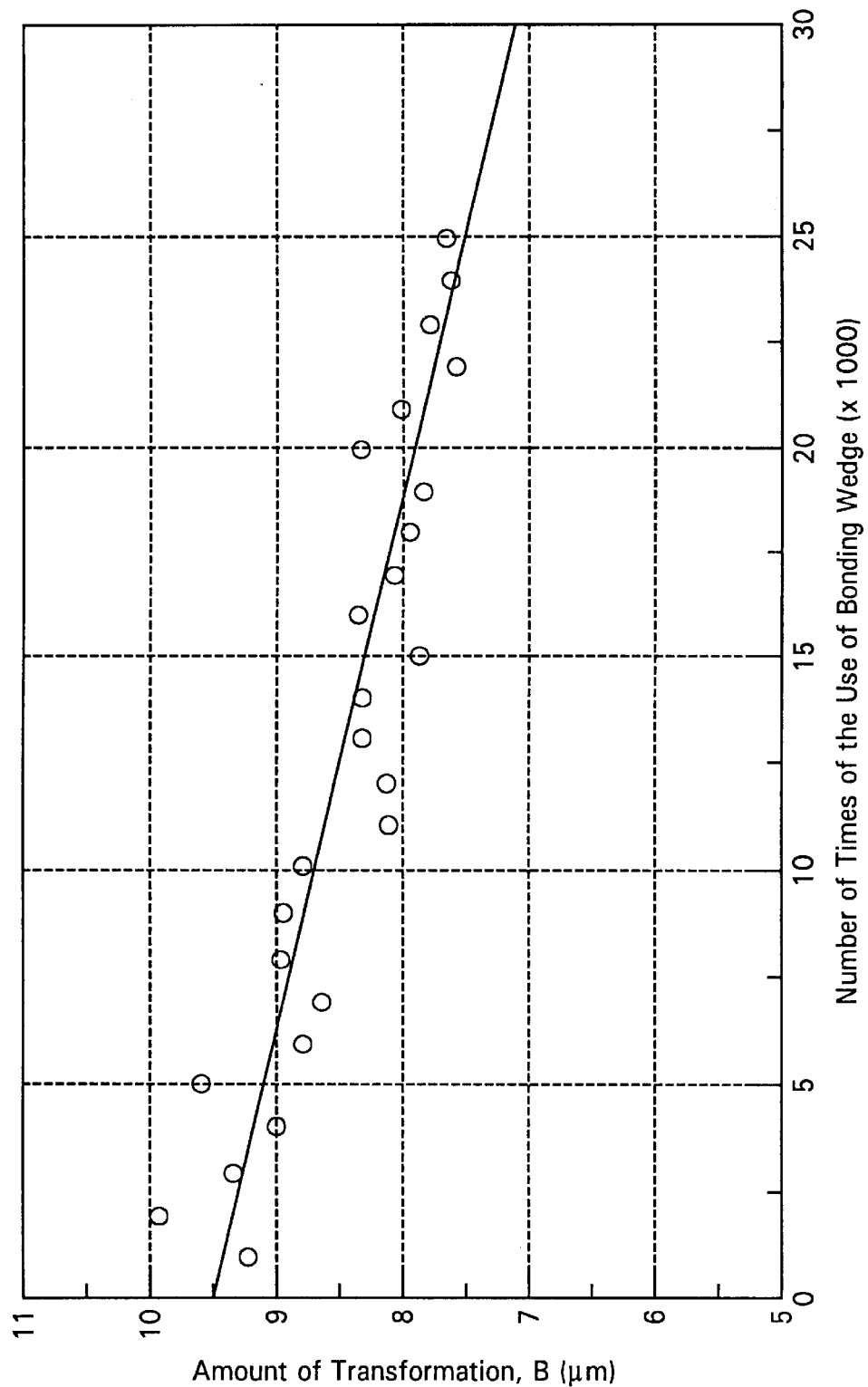
FIG. 9 is a diagram showing the transformation amount B which varies according to the number of times of the use of the bonding wedge.

FIG. 9 is a diagram showing the relation between the number of times of the use of the bonding wedge and the transformation amount B. The bonding wedge 21 of the ultrasonic bonder 100 is an expendable supply and is worn away according to the number of times of the use of the bonding wedge 21. For this reason, the bonding wedge 21 will be exchanged if the number of times of the use of the wedge 21 reaches a certain fixed number of times.

A variation in the nugget width has been investigated over the service life of the bonding wedge 21, and it has been found that the nugget width is maintained uniform at each occasion, however, the nugget width becomes smaller, as the number of times of the use of the bonding wedge 21 is increased. Furthermore, a variation in the transformation amount B has been investigated over the service life of the bonding wedge 21, and it has been found that the transformation amount B also becomes smaller, as the number of times of the use of the bonding wedge 21 is increased. As shown in FIG. 9, the transformation amount B is reduced approximately proportionally with the number of times of the use of the bonding wedge 21.

Figure 10B:
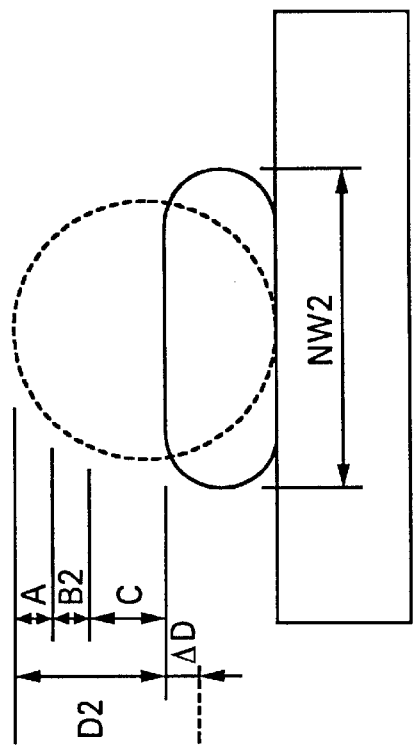
FIG. 10 is a diagram showing the relation between the number of times of the use of the bonding wedge and the transformation amount of the wire.
Figure 10A:
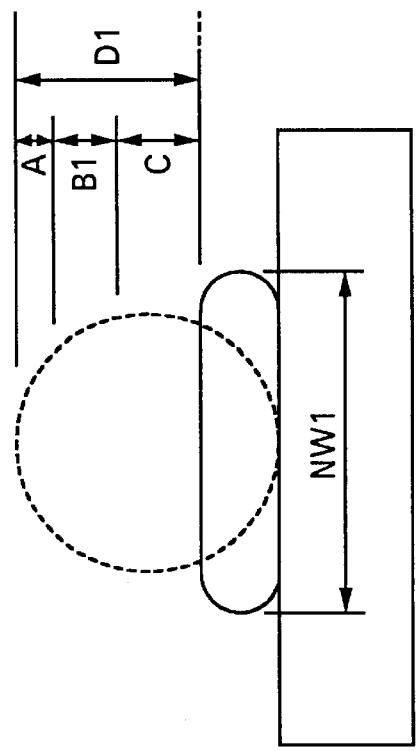

FIG. 10 is a diagram showing the relation between the number of times of the use of the bonding wedge and the transformation amount of the wire. As shown in FIG. 10A, when the frequency use of the bonding wedge 21 is low, proper transformation amount B1 corresponding to the transformation amount A is obtained. Thereafter, the wire 71 transforms by the transformation amount C and therefore the entire transformation amount D1 of the wire 71 becomes:

$$D1=A+B1+C$$

On the other hand, as shown in FIG. 10B, if the number of times of the use of the bonding wedge 21 becomes high, transformation amount B2 smaller than the transformation amount B1 is obtained. Therefore, if it is assumed that the transformation amount A is the same, the entire transformation amount D2 of the wire 71 becomes:

$$D2=A+B2+C$$

From this fact it follows that the difference DB between the transformation amount B1 and the transformation amount B2 has a great influence on the difference DD between the transformation amount D1 and the transformation amount D2.

Hence, the wire bonding method and apparatus of the second embodiment compensates for a reduction in the transformation amount B by the transformation amount C. Therefore, even in the case where the bonding wedge is worn away and reduced in ability, the transformation amount of the wire will properly be obtained.

Figure 11:
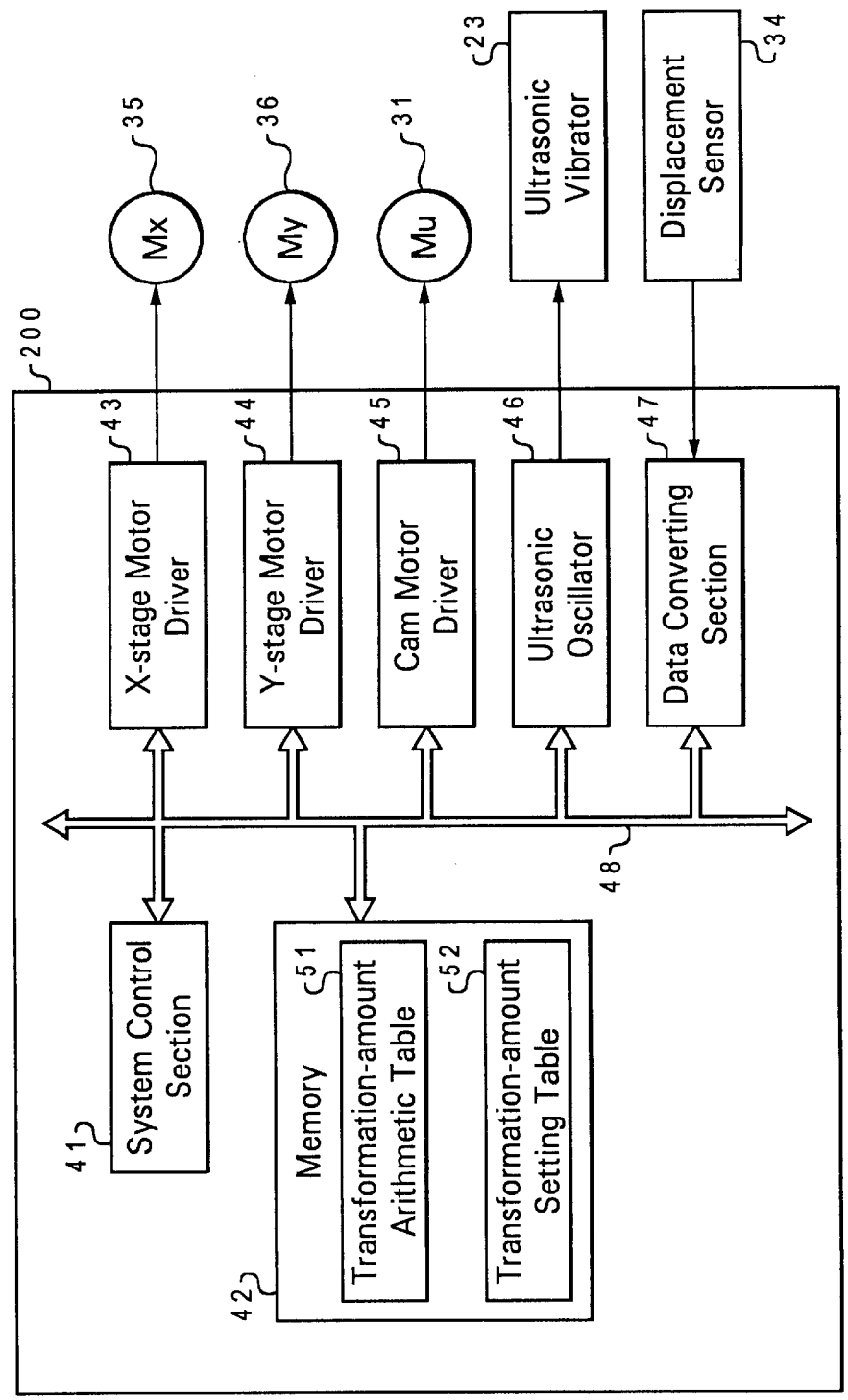
FIG. 11 is a schematic diagram showing the construction of the control circuit of an ultrasonic bonder according to a second embodiment of this invention.

FIG. 11 is a schematic diagram showing the construction of the control circuit of an ultrasonic bonder according to a second embodiment of this invention. The ultrasonic bonder in the second embodiment is the same as the first embodiment, except that a transformation-amount setting table 52 is provided in the memory 42.

FIG. 12 is a diagram showing the transformation-amount setting table shown in FIG. 11. As shown in FIG. 12, this transformation-amount setting table 52 correlates the number of times of the use of the bonding wedge 21 with the transformation amount C. For example, in the transformation-amount setting table 52, an amount of transformation C' is set such that it increments by 0.2 mm, each time the bonding wedge 21 is used 2500 times. The transformation amount C' indicates a difference with respect to a reference amount of transformation C0.

Returning to FIG. 11, the memory 42 further stores the reference transformation amount C0 and the number of times of the use of the bonding wedge 21. The system control means 41 calculates the transformation amount C by adding the transformation amount C' corresponding to the number of times of the use of the bonding wedge 21 to the reference transformation amount C0, making reference to the transformation-amount arithmetic table 51.

Figure 13B:
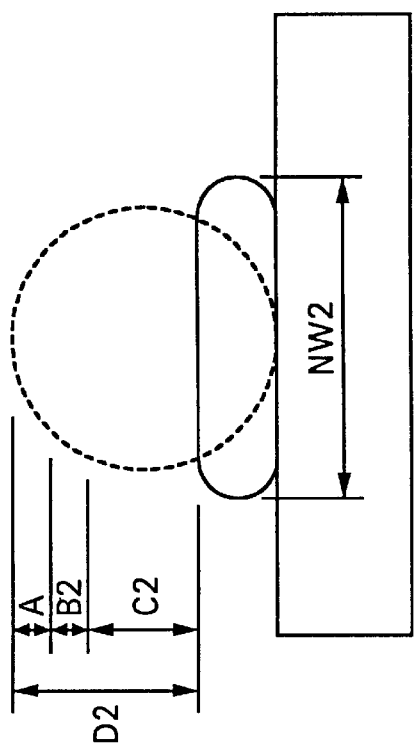
FIG. 13 is a diagram showing the wire bonding method of the second embodiment.
Figure 13A:
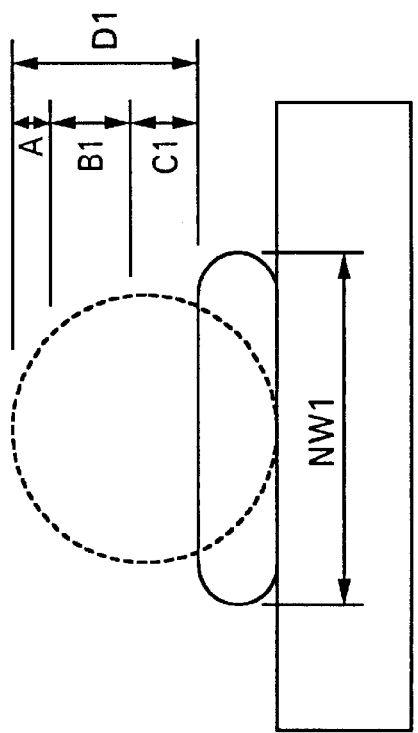
Figure 14A:
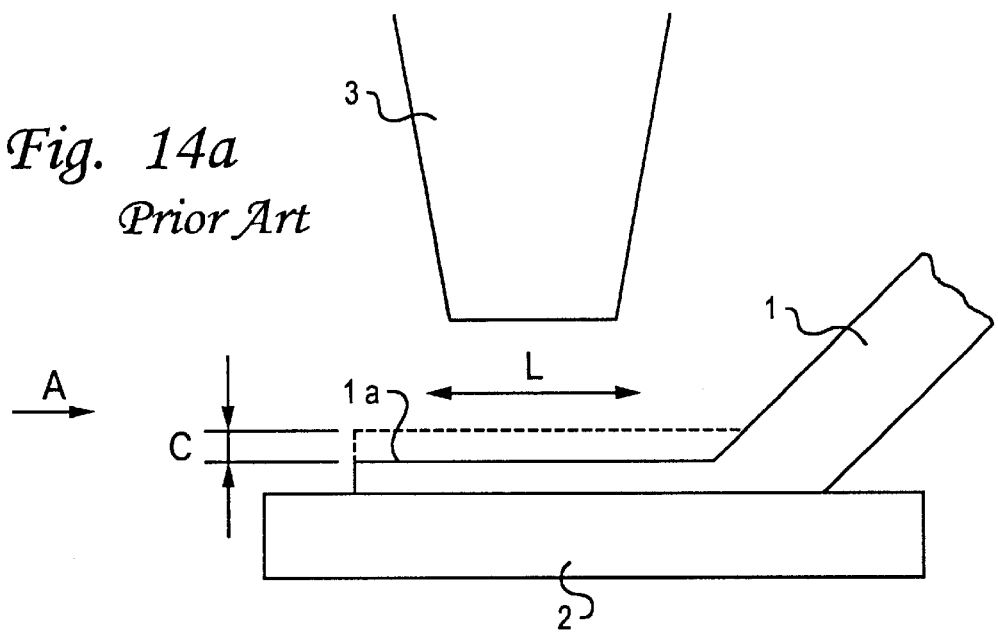
FIG. 14 is a diagram showing a wire bonded on a connection pad, FIG. 14A showing the front view and FIG. 14B showing the top view.
Figure 14B:
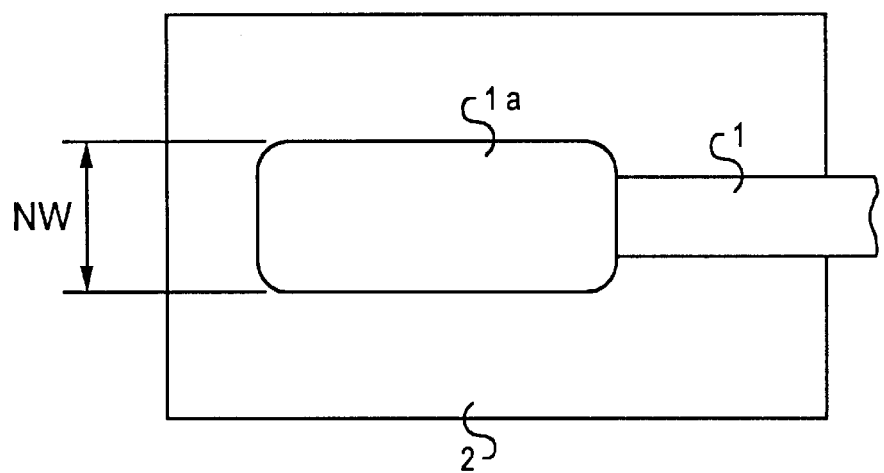

FIG. 13 is a diagram showing the wire bonding method of the second embodiment. When the number of times of the use of the bonding wedge 21 is low, a proper transformation amount B1 corresponding to the transformation amount A is obtained as shown in FIG. 13A. Thereafter, the wire 71 transforms by the transformation amount C1, and consequently, the entire transformation amount D1 of the wire 71 becomes:

$$D1=A+B1+C$$

On the other hand, if the number of times of the use of the bonding wedge 21 becomes high, a transformation amount B2 smaller than the transformation amount B1 is obtained as shown in FIG. 13B. For this reason, the transformation amount C2 in which a reduction DB in the is transformation, amount B2 with respect to this transformation amount B1 is added to the transformation amount C1 is used. For this reason, when the transformation amount A is assumed to be the same, the entire transformation amount D2 of the wire 71 becomes:

$$\begin{aligned} D2 &= A + B2 + C2 \\ &= A + (B1 - DB) + (C1 + DB) \\ &= A + B1 + C1 \\ &= D1 \end{aligned}$$

Thus, even when the number of times of the use of the bonding wedge 21 increases, nearly the same transformation amount of the wire is obtained.

In the conventional wire bonding method and apparatus, the service life of the bonding wedge 21 is in the order of 20,000 times by reason that if the number of times of the use of the bonding wedge 21 increases, an unnecessary portion of the wire after bonding is difficult to cut. On the other hand, in the wire bonding method and apparatus of the second embodiment, the service life of the bonding wedge 21 has been improved to 40,000 times, because the second embodiment suitably compensates for the transformation amount C in accordance with the number of times of the use of the bonding wedge 21 and obtains the transformation amount D which is approximately constant. In this way, the second embodiment is able to reduce the cost for bonding a wire.

Advantages of the Invention

According to the wire bonding method and apparatus of this invention, the bonding wedge first abuts the wire, whereby a predetermined load is given between the wire and the connection pad. This load causes the wire to transform. The transformation amount of the wire varies greatly. Next, through this bonding wedge, the predetermined load and a predetermined ultrasonic wave vibration are given between the wire and the connection pad for a predetermined time, whereby the wire is further transformed. In this way, a variation in the transformation amount of the wire is absorbed and becomes small. And the transformation amount of the wire to be measured is set to an initial value. Until the transformation amount of the wire reaches a predetermined set value, the predetermined load and the predetermined ultrasonic wave vibration are given between the wire and the connection pad, while the transformation amount of the wire is being measured.

Therefore, a variation in the transformation amount of the wire can be reduced before the measurement of the transformation amount of the wire is started. If the transformation amount of the wire thereafter is managed, the entire transformation amount of the wire can be reduced. Therefore, the reliability of the wire-bonding strength can be enhanced.

In addition, according to the wire bonding method and apparatus of this invention, a set value for the transformation amount of the wire is increased according to the number of times of the use of the bonding wedge. For this reason, an amount of transformation, for absorbing a variation in the transformation amount of the wire caused when the bonding wedge is brought into contact with the wire, can be compensated by the set value for the transformation amount of the wire, and consequently, a constant transformation amount of the wire is obtainable over the service life of the bonding wedge 21. As a result, the reliability of the wire-bonding strength can be further enhanced.

What is claimed is:

1. A wire bonding method for bonding wires to connection pads, comprising:

touching the wires to a bonding wedge and applying a predetermined load between the wires and connection pads; then vibrating the bonding wedge with a predetermined ultrasonic wave vibration with the predetermined load for a predetermined time providing the predetermined ultrasonic wave vibration with the predetermined load between the wires and connection pads, while measuring an amount of wire transformation until the amount of wire transformation reaches a predetermined set value, the amount of wire transformation being set at an initial value, wherein the amount of wire transformation is achieved by the predetermined load after the predetermined time in the time controlling step; and wherein the set value for the amount of wire transformation in the transformation amount controlling step increases according to the number of times of the use of the bonding wedge.

2. A wire bonding method of bonding wires to connection pads, comprising:

supporting wires and connection pads in a planar orientation with a load applicator;

applying an initial, vibration-free, predetermined load to the wires, along a length of the wires, and the connection pads with a bonding wedge that is transverse to the planar orientation;

providing a predetermined ultrasonic wave vibration to the wires and connection pads through the bonding wedge with an ultrasonic wave vibration provider;

measuring an amount of wire transformation with a transformation amount measuring apparatus;

controlling operation of the load applicator, the ultrasonic wave vibration provider, and the transformation amount measuring apparatus with a controller by:

first, touching the wires to the bonding wedge with the load applicator, applying the predetermined load between the wires and connection pads through the bonding wedge, and transforming the wires;

then, applying the predetermined load for a predetermined time with the load applicator, and at the same time, providing the predetermined ultrasonic wave vibration for the predetermined time with the ultrasonic wave vibration provider;

after the predetermined time, setting the amount of wire transformation at an initial value with the transformation amount measuring apparatus, and providing the predetermined ultrasonic wave vibration with the ultrasonic wave vibration provider, while the predetermined load is being applied by the load applicator, until the amount of wire transformation measured by the transformation amount measuring apparatus reaches a predetermined set value;

storing a table correlating a number of times of use of the bonding wedge with a set value for the amount of wire transformation with a table storage unit in the controller, and counting the number of times of use of the bonding wedge with a counter; and wherein the controller reads out The set value, which corresponds to the amount of wire transformation corresponding to the number of times of the use counted by the counter, from the table storage unit and also sets a set value for the amount of wire transformation.

* * * * *